United States Patent [19]

Anagnostopoulos

[11] Patent Number: 5,804,844
[45] Date of Patent: Sep. 8, 1998

[54] SOLID-STATE IMAGER WITH CONTAINER LOD IMPLANT

[75] Inventor: C. N. Anagnostopoulos, Mendon, N.Y.

[73] Assignee: Eastman Kodak Company, Rochester, N.Y.

[21] Appl. No.: 780,429

[22] Filed: Jan. 8, 1997

Related U.S. Application Data

[63] Continuation of Ser. No. 405,167, Mar. 16, 1995, abandoned.

[51] Int. Cl.$^6$ .................. H01L 27/148; H01L 29/768
[52] U.S. Cl. .................. 257/223; 257/230; 257/231; 257/233
[58] Field of Search .................. 257/222, 223, 257/229, 230, 231, 233

[56] References Cited

U.S. PATENT DOCUMENTS

| | | |
|---|---|---|
| 4,396,438 | 8/1983 | Goodman . |
| 4,460,912 | 7/1984 | Takeshita et al. . |
| 4,579,626 | 4/1986 | Wallace . |
| 4,593,303 | 6/1986 | Dyck et al. . |
| 4,607,429 | 8/1986 | Kosonocky ............... 29/572 |
| 4,613,402 | 9/1986 | Losee et al. . |
| 4,694,476 | 9/1987 | Oda . |
| 4,794,279 | 12/1988 | Yamamura et al. . |
| 4,856,033 | 8/1989 | Hirota . |
| 5,122,850 | 6/1992 | Burkey . |
| 5,130,774 | 7/1992 | Stevens et al. . |
| 5,181,093 | 1/1993 | Kawaura . |
| 5,276,520 | 1/1994 | Hawkins et al. . |
| 5,349,215 | 9/1994 | Anagnostopoulos et al. ........ 257/223 |

OTHER PUBLICATIONS

W. F. Keenan & H. H. Hosack, "A Channel–Stop–Defined Barrier and Drain Antiblooming Structure for Virtual Phase CCD Image Sensors", *IEEE Transactions On Electron Devices*, vol. 36, No. 9, Sep. 1989.

*Primary Examiner*—Ngân V. Ngô
*Attorney, Agent, or Firm*—James D. Leimbach

[57] ABSTRACT

A CCD pixel 10 has an antiblooming structure including a lateral overflow drain 36 of one conductivity. The drain 36 is mounted on one side by a heavy dope channel stop region. The rest of drain 36 is bounded by a heavily doped container region 38 that is formed in the same opening that is used to form LOD 36.

17 Claims, 4 Drawing Sheets

SOLID-STATE IMAGER WITH CONTAINER LOD IMPLANT

This is a Continuation of application Ser. No. 08/405, 167, filed 16 Mar. 1995, now abandoned.

The present invention relates to charged coupled device (CCD) solid-state image sensors having antiblooming structures and, more particularly to a lateral overflow drain antiblooming structure for CCD solid-state image sensor with a container LOD implant.

BACKGROUND

Solid-state image sensors, in general, comprise a photodetector for detecting radiation from an image and converting the radiation to charge carriers. Transfer means carry the charge carriers to an output circuit. Frame transfer solid-state image sensors use a CCD as both the photodetector and the transfer means. Half frame devices have separate areas for receiving and transferring charges. The solid-state image sensor generally includes a plurality of CCDs arranged in spaced parallel relation to form an area array.

CCD imagers experience a problem known as blooming. Blooming is a phenomena that occurs when the number of charge carriers generated in a photodetector site by the incident radiation exceeds the storage capacity of the site. Blooming typically happens when a bright object, for example such as a light bulb, becomes imaged on a portion of the CCD. The excess charge carriers then spill over or bloom into an adjacent photodetector sites thereby degrading the integrity of the image. The problem of blooming is often addressed by various antiblooming structures including structures with vertical overflow drains and lateral overflow drain structures. Examples of lateral overflow drains structures may be found in U.S. Pat. No. 5,349,215 assigned to the same assignee as this invention.

In full frame or frame transfer CCD imagers, blooming is prevented along a column by providing an overflow drain that removes access photogenerated electrons once the pixels in the vicinity of the high elimination region have reached their saturation levels. Because full frame imagers are operated in the accumulation mode, the lateral overflow drain (LOD) antiblooming structure may not function. In the accumulation mode, the vertical CCD clock voltages are set to a high negative potential, typically −8 volts, during the integration period. Frame transfer CCD imagers are operated at a high negative potential to suppress dark current that results from the silicon/silicon dioxide interface of gate electrodes on the storage areas. Dark current is a negligible in CCD imagers with separate receiving and transfer areas. Such imagers have typically short integration times and fast read out times and so can use antiblooming structures that do not need to operate with large negative gate potentials. At a −8 volts gate voltage using a conventional antiblooming structure such as shown in U.S. Pat. Nos. 4,607,429 or 4,396,438, the channel from the CCD storage area to the LOD will be turned off and the excess photogenerated signal cannot be drained off. Instead, excess signal will overflow into the adjacent pixels in the vertical direction, resulting in blooming. Such conventional LOD antiblooming structures will fail when operated in the accumulation mode because they impede the flow of positive charges (holes) in and out of each pixel. Such charges are needed for proper accumulation mode of operation. So, such antiblooming structures are not compatible with frame transfer devices operating in an accumulation mode. Accordingly, there has developed a need for an LOD which will operate when a high negative potential gate voltage is applied to the channel.

SUMMARY

The invention provides a solid-state CCD image sensor in a substrate of semiconductor material. The top surface of the semiconductor material has at least one photodetector, and the photodetector has first and second storage areas. There is a first barrier between the first and second storage areas. A second barrier is provided between the second storage area and an adjacent photodetector. The second barrier is shallower than the first barrier. The LOD is adjacent to the second barrier and has a conductivity the same as the conductivity of the photodetector and is adjacent to the photodetector. An antiblooming overflow barrier is provided between the LOD and only the second storage area. The antiblooming barrier has a potential deeper than the second barrier and is a primary antiblooming path between the photodetector and the LOD. A container having a conductivity opposite the conductivity of the LOD is disposed between the antiblooming overflow barrier and the LOD. The container is formed by an implant through the same opening that is used to implant the LOD. The container reduces the depletion region of the LOD implant and thereby increases the area available for charge accumulation. The container is more heavily doped than the antiblooming overflow barrier. In forming the container, either the LOD implant or the container implant may be made first since the order is not critical. The invention has the advantage of a smaller depletion region for the LOD and reduces overall pixel size without adversely affecting performance.

DETAILED DESCRIPTION OF THE INVENTION

Figure 1:
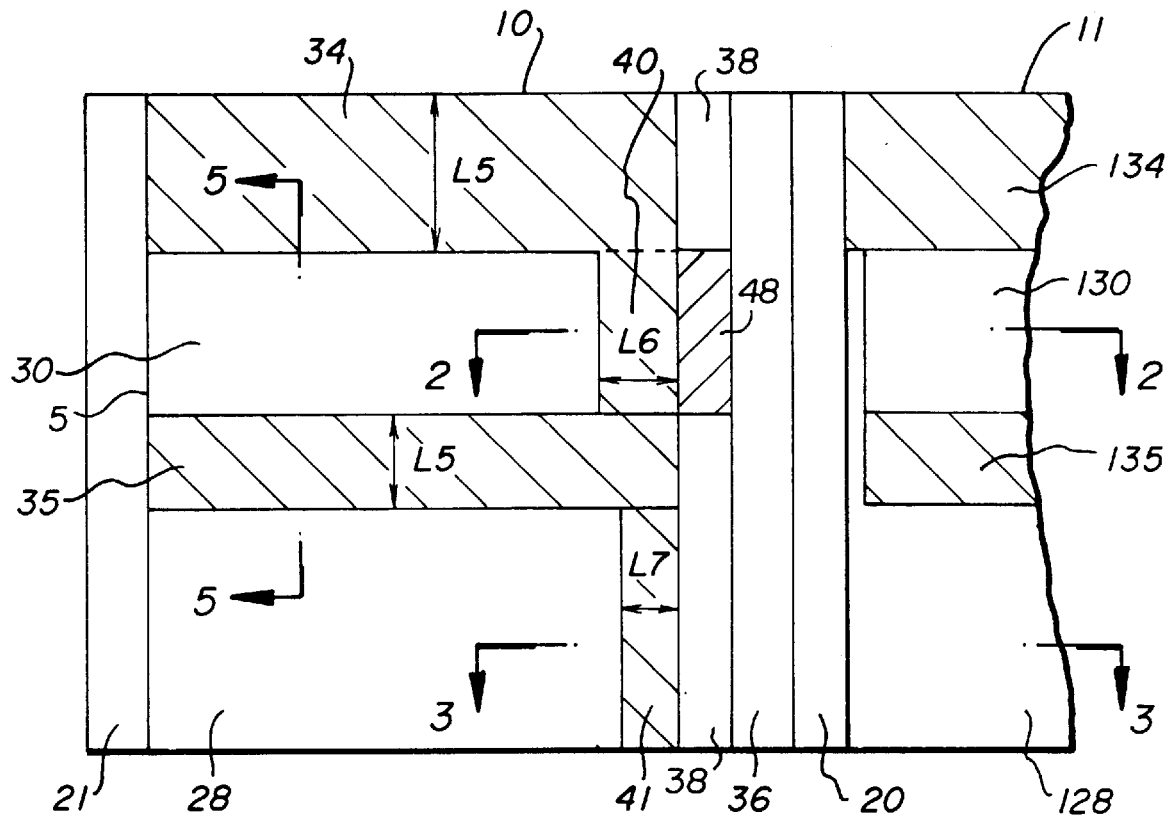
FIG. 1 is a top plan view of one pixel of solid-state imager including the invention.
Figure 2:
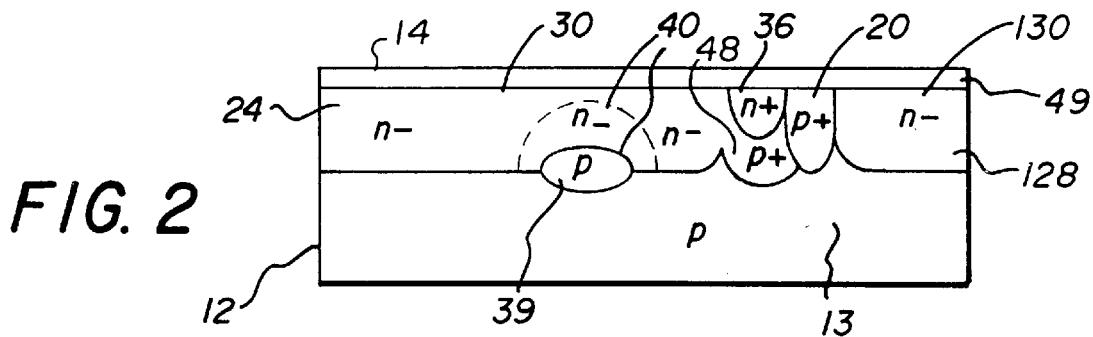
FIG. 2 is a cross-sectional view taken along line 2—2 of FIG. 1.
Figure 3:
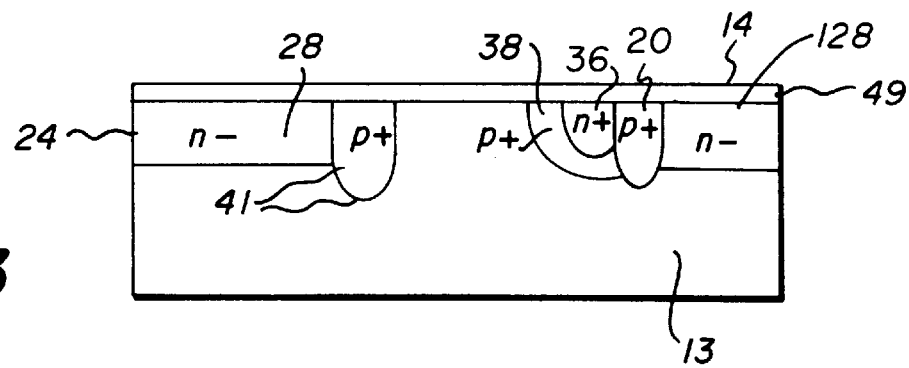
FIG. 3 is a cross-sectional view similar along the line 3—3 of FIG. 1.

Referring to FIGS. 1,2 and 3, they show adjacent pixels 10, 11 of a CCD, solid-state image sensor. Pixels 10, 11 are formed in a semiconductor substrate 12 of one conductivity type (typically p-type conductivity). The semiconductor substrate 12 is typically single crystal silicon. A CCD channel region 24 of the opposite conductivity (n-type conductivity) is formed in the top surface of the semiconductor 12. Although only two CCD pixels 10, 11 are shown a large number of additional pixels (not shown) are arranged in spaced parallel relationship to pixels 10, 11. Recent CCD sensors include as many as six (6) million pixels. Those skilled in the art will know that the finished sensor has a gate oxide (not shown) covering the channel 24 and first and second lines of polysilicon conductors (not shown) on the gate oxide forming gate electrodes. By applying suitable potentials to the gate electrodes, the full frame CCD is placed in either it s integration mode or in its transfer mode.

CCD pixel 10 has a photodetector 5 with two storage areas. In FIG. 1, pixel 10 has a first storage area 28 (phase one) and a second storage area 30 (phase two) divided by first barrier 35. In a similar manner, adjacent pixel 11 has a first storage area 128 and second storage area 130 separated by barrier 135. As shown in FIG. 1, between the storage area 30 and an adjacent photodetector (not shown) there is a second barrier 34. Adjacent to storage area 30 is a lateral overflow drain (LOD) 36. The channel 24 in storage area 30 has a barrier region 40 which includes a lightly doped n region to the LOD 36. Barrier 40 is spaced from the top surface 14 and extends to boron implant 39. Barrier region 40, indicated by the dotted line generally referred to as 40, is formed as a result of boron implant 39 and channel 24.

As shown in FIG. 2, the channel region 24 of storage region 30 is interrupted by an overflow barrier 40 which extends from the p-type substrate 12 to the surface 14 of the substrate 12. Channel stops 20, 21 are disposed on opposite sides of the pixel 10. Channel stop 20 is adjacent the LOD region 36. The LOD 36 is a heavily doped n-typed region. The adjacent channel stop 20 is a heavily doped p-type region that extends from the surface 14 to the substrate. The channel stop 20 is adjacent one edge of the LOD 36. The rest of the LOD region 36 is contained in a p-type container region 38. The LOD 36 and the container region 38 are both spaced from the barrier 41 in FIG. 3 and from barrier 40 in FIG. 2. The barrier region 40 is a very lightly doped n-type region that results from arsenic ions implanted to form the channel region 24 and a boron implant 39. The container region 38 is more heavily doped than p-type antiblooming barrier region 41. Container region 38 is adjacent one edge and the lower surface of LOD 36; channel stop 20 is adjacent the other edge of LOD 36. So LOD 36, adjacent storage area 30, is enclosed in substrate 12 by the container region 48 and channel stop 20.

Figure 5:
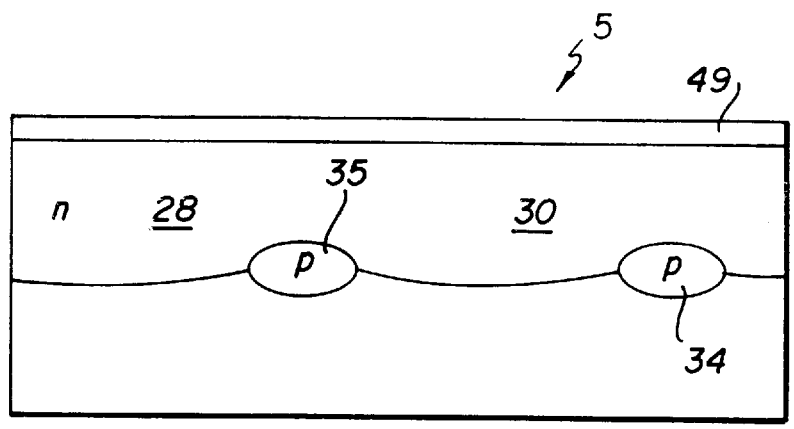
FIG. 5 is a cross- sectional view of the invention taken along line 5—5 of FIG. 1.

Barriers 34, 35 have the same length L5. The length L6 of the overflow barrier 40 in pixel 10 is the distance across the barrier 40 in direction toward the LOD region 36. As such, the distance across barrier 40 is shorter than the length L5 of barriers 34, 35. As a result, the potential of barrier 40 is deeper than that of barrier 34. This insures that no blooming will occur since excess photocurrent from storage area 28 (phase one) will go into the preceding storage area 30 (phase two). Excess photocurrent from storage area 30 (phase two) will then go into the lateral overflow drain 36 via 40. The length L7 of barrier 41 is the shortest and may be the minimal distance allowed by the process technology used to fabricate the imager. Now referring to FIG. 5, which is a cross sectional view of the invention taken along line 5—5 of FIG. 1, an illustration of the photodetector area 5 having first storage area 28 and second storage area 30 separated by first barrier region 35 is clearly illustrated. As stated previously under the description to FIG. 1, second barrier separates the second storage area 30 from an adjacent photodetector (not shown). Thin oxide layer 49 covers the top of photodetector 5.

Figure 4:
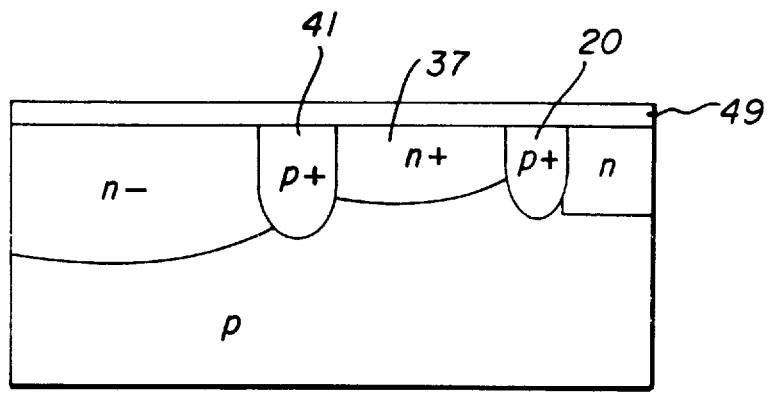
FIG. 4 is a prior art cross sectional view corresponding to FIG. 3.

In prior art devices such as shown in FIG. 4, the lateral overflow drain 37 was bounded on one side by heavily doped channel stop region 20. However, the rest of the LOD region 37 was not contained. For example, it extended into the channel region 34 and to the lightly doped p-type substrate 12. In contrast, the invention provides a heavily doped p-type container 38 which sharply confines the LOD drain 36 between the container 38 and the channel stop 20.

However, the high potential applied on the LOD 36 maintains the electrical connection between the storage area 30 and the drains 36 so that the antiblooming function is maintained.

Figure 8:
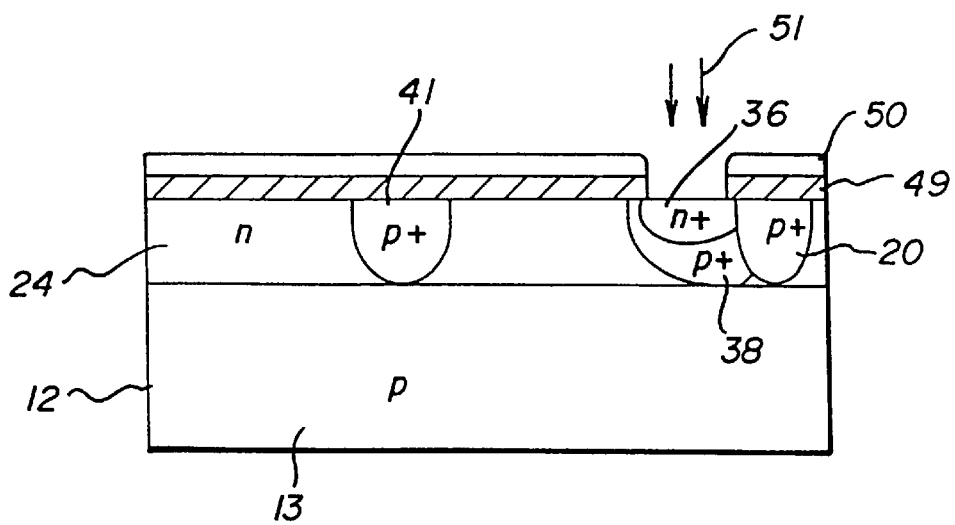
FIG. 8 is a cross-section view of the process used to form the LOD.

The container 38 is formed in the same opening that is used to form the LOD 36. With reference to FIG. 8, the semiconductor substrate 12 has a thin oxide layer 49 coated with a suitable resist 50 such as photoresist. The resist 50 is patterned and an aperture 51 is opened to define the LOD region 36. The LOD region 36 is implanted with a suitable n-type dopant such as phosphorus. Next, opening 51 receives a p-type implant such as boron, to form the p+ container region 38. It will be noted that boron diffuses faster than phosphorus and so, during subsequent thermal processing, the boron atoms move away from the opening 51 while the slower phosphorus atoms tend to congregate near the opening 51 of the photoresist 50. Accordingly, the container 38 and LOD 36 structures are formed by implanting two dopants of different diffusion constants into the semiconductor substrate 12.

The advantages of containing the depletion width of the LOD region 36 inside a container region 38 include increase quantum efficiency of the sensor 10, increased alignment tolerance for implants near the LOD region 36, higher packing density, and increased horizontal crosstalk. Such increased horizontal crosstalk renders the crosstalk more uniform. The latter may not initially appear as an advantage since crosstalk is generally undesired. However, crosstalk is normally reduced by suitable software processing techniques. Such techniques have in the past overcompensated for horizontal crosstalk because the deep LOD of prior art devices reduced horizontal crosstalk and the software techniques did not distinguish between vertical and horizontal crosstalk. Now crosstalk is more symmetrical and thus is uniformly processed and reduced by the software techniques.

Figure 6:
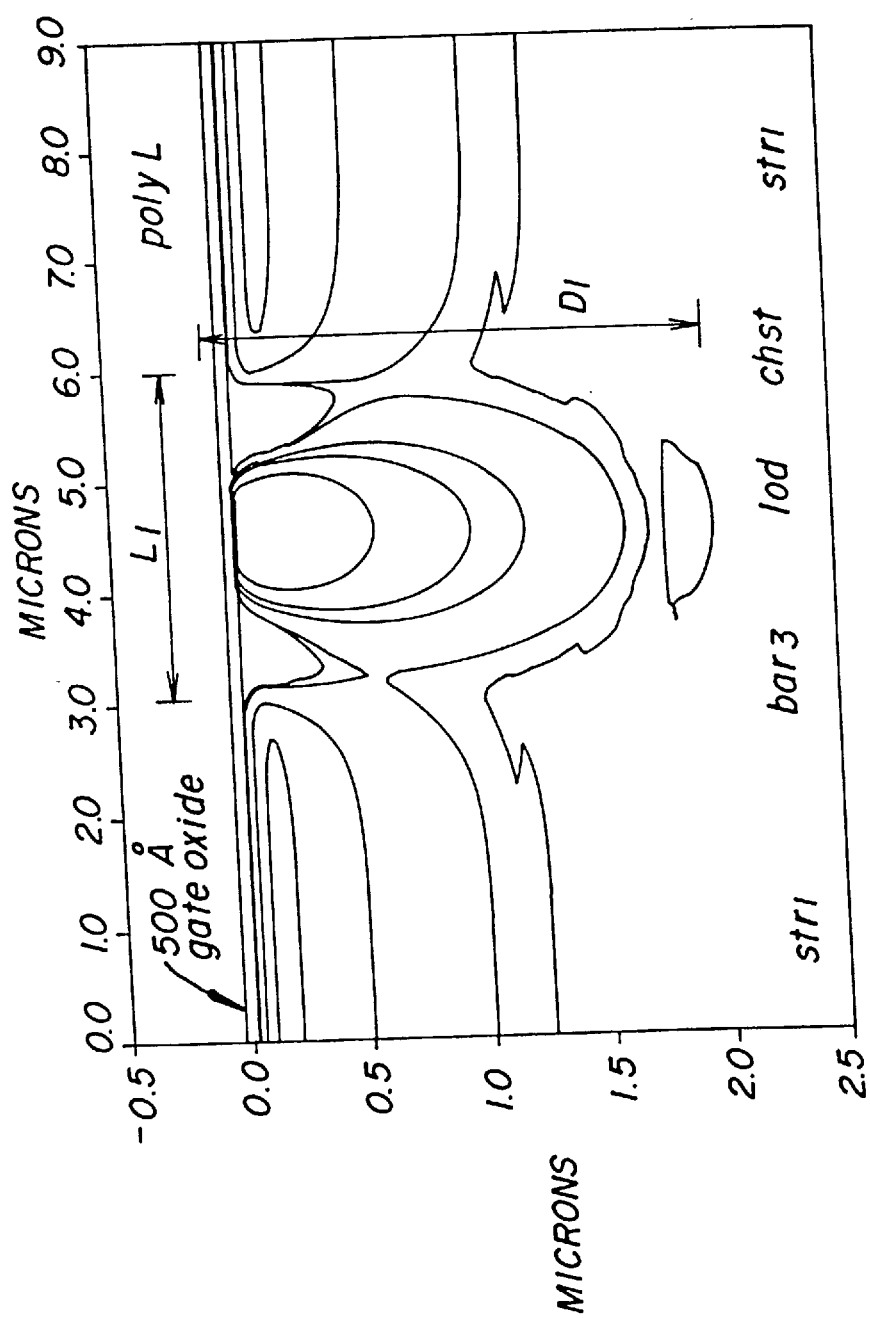
FIG. 6 is a cross- sectional view showing the potential contours of the LOD structure of FIG. 4.
Figure 7:
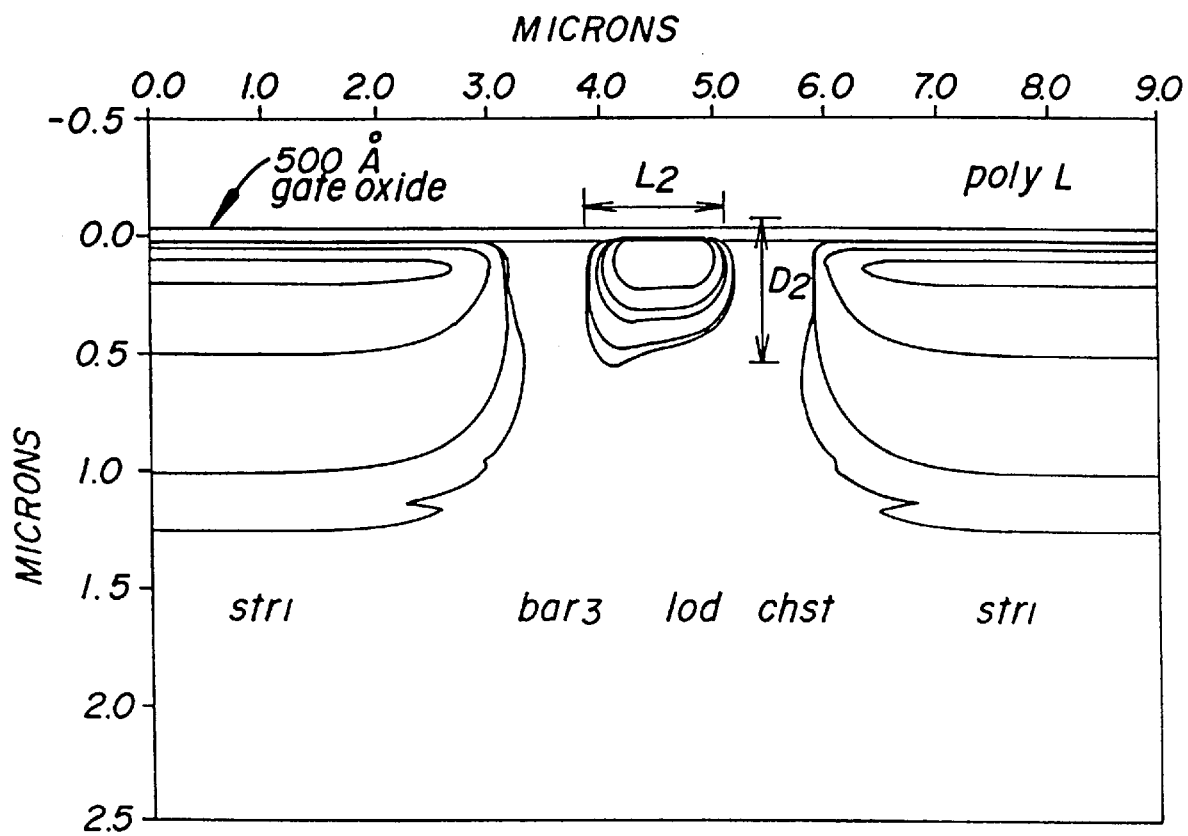
FIG. 7 is a cross- sectional view similar to that of FIG. 6 showing the potential contours of the gate structure of the invention.

FIG. 6 shows potential contours for a standard LOD architecture without a container implant in a process with 0.8 micron minimum feature dimensions and −8 volt gate voltage. FIG. 7 shows a similar structure but includes a 100 kev, $5 \times 10^{12}$ boron container implant 38 that was performed through the same opening 51 as the LOD implant 36. When FIG. 6 is compared to FIG. 7 it is clear that the quantum efficiency for the device of FIG. 1 will be higher, the alignment tolerances are also higher and allows for further reduction in minimum dimensions. In particular, the inventive structure with the LOD 36 contained in a contained region 38 minimizes the extension of the LOD depletion region. For example, FIG. 6 (prior art) has a depletion region for its LOD that has a length L1, of about three (3) microns and extends for a depth D1, of about two (2) microns. In contrast, the LOD 36 of the invention, as shown in FIG. 7, has a length L2 about one (1) micron and a depth D2 of about 0.5 microns. The smaller LOD 36 of the invention leaves larger proportions of areas 28, 30 available to receive and store charges generated by incident light. With the contained LOD 36 of the invention, the overall pixel size can be reduced but the areas 28, 30 can remain the same size thus holding the same charge as larger pixel structures in prior art devices. As such, the container LOD 36 results in a substantially smaller pixel, so more pixels are formed in a given size imager, thereby increasing resolution of the image.

Having described the preferred embodiment of the invention, those skilled in the art will appreciate the further modifications, additions, and changes may be made thereto without departing from the spirit and scope of the invention as set forth in the following claims. For example, the preferred embodiment relies upon ion implantation, but those skilled in the art know that other methods would be used, including but not limited to gaseous diffusion into the substrate, and autodoping from a doped layer.

What I claim is:

1. A solid-state image sensor comprising:

a substrate of a semiconductor material having a top surface;

at least one pixel in the top surface of the substrate having a photodetector, the photodetector having first and second storage areas, respectively, and each storage area having a conductivity of one type;

a first barrier between said first and second storage areas that generates a first potential;

a second barrier between the second storage area and an adjacent photodetector wherein a second potential generated by the second barrier that is deeper than the first potential generated by the first barrier;

a lateral overflow drain (LOD) adjacent the second barrier and having a conductivity the same as the conductivity of the photodetector and adjacent to the photodetector; and a container having a conductivity opposite the conductivity of the LOD, the container being formed essentially below the LOD such that it does not extend to the top surface.

2. The solid-state imager of claim 1 wherein the overflow drain comprises an n-type dopant and the container comprises a p-type dopant.

3. The solid-state imager of claim 1 wherein the n-typed dopant is phosphorus and the p-type dopant is boron.

4. The solid-state image of claim 1 further comprising an antiblooming overflow barrier between the LOD and only the second storage area, wherein the antiblooming barrier has a potential deeper than the second barrier and is a primary antiblooming path between the photodetector and the LOD.

5. The solid-state imager of claim 4 wherein the container has a doping concentration greater than the antiblooming overflow barrier.

6. The solid-state imagery of claim 1 further comprising a channel stop adjacent the LOD.

7. A solid-state image sensor comprising: formed within the top surface of the substrate, each of the photodetectors having a plurality of storage areas formed from a first conductivity type;

a first set of barriers formed between storage areas within each photodetector, the first barriers each generating a first potential;

a second set of barriers formed between adjacent photodetectors, the second barriers each generating a second potential;

a lateral overflow drain (LOD) adjacent the second barrier and formed to have similar conductive characteristics as the storage areas;

a container having a conductivity opposite the conductivity of the LOD, the container being formed essentially below the LOD such that it does not extend to the top surface; and at least one storage area within each photodetector wherein a portion of the second barrier adjacent to the one storage area generates a deeper potential than the first potential.

8. The solid-state imager of claim 7 wherein the container has a doping concentration greater than the antiblooming overflow barrier.

9. The solid-state imager of claim 7 wherein the overflow drain comprises an n-type dopant and the container comprises a p-type dopant.

10. The solid-state imager of claim 9 wherein the n-typed dopant is phosphorus and the p-type dopant is boron.

11. The solid-state image of claim 8 further comprising:

an antiblooming overflow barrier between the LOD and only the second storage area, wherein the antiblooming barrier has a potential deeper than the second barrier and is a primary antiblooming path between the photodetector and the LOD.

12. A solid state image sensing product having a plurality of photodetectors formed upon a semiconductor substrate, formed such that each photodetector has at least two storage areas defined by the steps of:

covering the surface of the substrate with a resist material;

opening the resist material adjacent the photodetectors;

doping the substrate through the opening with a dopant of one type of conductivity to form a Lateral Overflow Drain (LOD); and doping the substrate through the same opening with a dopant of an opposite conductivity for reducing the depletion region of the LOD and forming a container essentially underneath the LOD.

13. The product of claim 12 further defined by the steps of:

masking the substrate with a resist material, and opening the resist to expose a portion of the substrate spaced from the LOD, and doping the exposed portion of the substrate to form an antiblooming overflow barrier spaced from the LOD.

14. The product of claim 13 wherein the step of doping of the antiblooming barrier and the container are of the same conductivity.

15. The product of claim 13 wherein the container is more heavily doped than is the antiblooming overflow barrier.

16. The product of claim 13 wherein the container dopant has a higher rate of diffusion into the substrate than the LOD dopant.

17. The product of claim 13 wherein the container dopant and LOD dopant are ion implanted.

* * * * *

UNITED STATES PATENT AND TRADEMARK OFFICE
CERTIFICATE OF CORRECTION

PATENT NO. : 5,804,844
DATED : September 8, 1998
INVENTOR(S) : C. N. Anagnostopoulos It is certified that error appears in the above-identified patent and that said Letters Patent is hereby corrected as shown below:

Col. 5, line 44    In Claim 7, line 44, after the word "comprising:" insert

-- a substrate of a semiconductor material having a top surface with a plurality of photodetectors --

Signed and Sealed this

Twenty-ninth Day of December, 1998

Attest:

BRUCE LEHMAN

*Attesting Officer*    Commissioner of Patents and Trademarks